(12) United States Patent
Margalit

(10) Patent No.: US 9,837,583 B2
(45) Date of Patent: Dec. 5, 2017

(54) LIGHT EMITTING DIODE PACKAGE AND METHOD OF MANUFACTURE

(71) Applicant: Mordehai Margalit, Zichron Yaaqov (IL)

(72) Inventor: Mordehai Margalit, Zichron Yaaqov (IL)

(*) Notice: Subject to any disclaimer, the term of this patent is extended or adjusted under 35 U.S.C. 154(b) by 111 days.

(21) Appl. No.: 14/591,627

(22) Filed: Jan. 7, 2015

(65) Prior Publication Data

US 2015/0108529 A1  Apr. 23, 2015

Related U.S. Application Data

(63) Continuation of application No. 13/413,293, filed on Mar. 6, 2012, now Pat. No. 8,952,405.

(Continued)

(51) Int. Cl.

| H01L 33/50 | (2010.01) |
|---|---|
| H01L 33/38 | (2010.01) |
| H01L 33/64 | (2010.01) |
| H01L 33/62 | (2010.01) |
| H01L 33/00 | (2010.01) |
| H01L 33/56 | (2010.01) |
| H01L 33/40 | (2010.01) |
| H01L 33/44 | (2010.01) |

(Continued)

(52) U.S. Cl.
CPC ........ H01L 33/502 (2013.01); H01L 33/0012 (2013.01); H01L 33/32 (2013.01); H01L 33/382 (2013.01); H01L 33/385 (2013.01); H01L 33/40 (2013.01); H01L 33/44 (2013.01); H01L 33/507 (2013.01); H01L 33/508 (2013.01); H01L 33/52 (2013.01); H01L 33/56 (2013.01); H01L 33/58 (2013.01); H01L 33/62 (2013.01); H01L 33/647 (2013.01); H01L 33/50 (2013.01); H01L 33/60 (2013.01); H01L 2933/005 (2013.01); H01L 2933/0016 (2013.01); H01L 2933/0025 (2013.01); H01L 2933/0033 (2013.01); H01L 2933/0041 (2013.01); H01L 2933/0066 (2013.01)

(58) Field of Classification Search
CPC ............... H01L 33/644; H01L 33/647; H01L 33/50–33/508; H01L 33/44; H01L 33/48; H01L 33/0079; H01L 33/0095
See application file for complete search history.

(56) References Cited

U.S. PATENT DOCUMENTS

| 6,501,091 B1 | 12/2002 | Bawendi |
|---|---|---|
| 6,727,518 B2 * | 4/2004 | Uemura .................. H01L 33/46 257/163 |

(Continued)

*Primary Examiner* — Mary Wilczewski
*Assistant Examiner* — Erik T Peterson
(74) *Attorney, Agent, or Firm* — Intrinsic Law Corp.

(57) ABSTRACT

A light emitting diode (LED) device and packaging for same is disclosed. In some aspects, the LED is manufactured using a vertical configuration including a plurality of layers. Certain layers act to promote mechanical, electrical, thermal, or optical characteristics of the device. The device avoids design problems, including manufacturing complexities, costs and heat dissipation problems found in conventional LED devices. Some embodiments include a plurality of optically permissive layers, including an optically permissive cover substrate or wafer stacked over a semiconductor LED and positioned using one or more alignment markers.

14 Claims, 12 Drawing Sheets

Related U.S. Application Data

(60) Provisional application No. 61/449,685, filed on Mar. 6, 2011, provisional application No. 61/449,686, filed on Mar. 6, 2011.

(51) Int. Cl.
  *H01L 33/32* (2010.01)
  *H01L 33/58* (2010.01)
  *H01L 33/52* (2010.01)
  *H01L 33/60* (2010.01)

(56) References Cited

U.S. PATENT DOCUMENTS

| | | | |
|---|---|---|---|
| 7,232,754 B2 | 6/2007 | Kirby et al. | |
| 7,910,940 B2 | 3/2011 | Koike et al. | |
| 7,951,625 B2 | 5/2011 | Kamei | |
| 8,278,213 B2 | 10/2012 | Kameyama et al. | |
| 2002/0017727 A1* | 2/2002 | Uemura | H01L 23/3107 257/778 |
| 2003/0006418 A1 | 1/2003 | Emerson et al. | |
| 2005/0017258 A1 | 1/2005 | Fehrer et al. | |
| 2005/0056855 A1* | 3/2005 | Lin | H01L 33/382 257/98 |
| 2005/0194605 A1* | 9/2005 | Shelton | H01L 33/62 257/99 |
| 2006/0006404 A1 | 1/2006 | Ibbetson et al. | |
| 2006/0011935 A1 | 1/2006 | Krames et al. | |
| 2006/0073692 A1 | 4/2006 | Yoshida et al. | |
| 2006/0081869 A1 | 4/2006 | Lu et al. | |
| 2006/0198162 A1* | 9/2006 | Ishidu | H01L 33/60 362/623 |
| 2006/0284321 A1 | 12/2006 | Wu et al. | |
| 2007/0096130 A1* | 5/2007 | Schiaffino | H01L 33/0079 257/98 |
| 2007/0166851 A1 | 7/2007 | Tran et al. | |
| 2008/0068845 A1 | 3/2008 | Aida et al. | |
| 2009/0108283 A1 | 4/2009 | Kadotani et al. | |
| 2009/0173958 A1 | 7/2009 | Chakraborty et al. | |
| 2009/0179207 A1* | 7/2009 | Chitnis | H01L 33/44 257/88 |
| 2009/0262516 A1 | 10/2009 | Li | |
| 2009/0267096 A1 | 10/2009 | Kim | |
| 2009/0273002 A1 | 11/2009 | Chiou et al. | |
| 2009/0283787 A1 | 11/2009 | Donofrio et al. | |
| 2009/0291518 A1 | 11/2009 | Kim et al. | |
| 2010/0053929 A1 | 3/2010 | Bisberg | |
| 2010/0148193 A1 | 6/2010 | Duong et al. | |
| 2010/0207145 A1 | 8/2010 | Yoo | |
| 2011/0006322 A1 | 1/2011 | Li | |
| 2011/0012164 A1* | 1/2011 | Kim | H01L 33/387 257/99 |
| 2011/0031516 A1* | 2/2011 | Basin | H01L 33/507 257/98 |
| 2011/0073889 A1* | 3/2011 | Sugizaki | H01L 25/048 257/98 |
| 2011/0114978 A1* | 5/2011 | Kojima | H01L 33/382 257/98 |
| 2011/0233585 A1* | 9/2011 | Kojima | H01L 33/486 257/98 |
| 2011/0233586 A1* | 9/2011 | Kojima | H01L 33/0079 257/98 |
| 2011/0266560 A1* | 11/2011 | Yao | H01L 33/0079 257/88 |
| 2011/0297980 A1* | 12/2011 | Sugizaki | H01L 33/38 257/98 |
| 2012/0074441 A1* | 3/2012 | Seo | H01L 27/153 257/91 |
| 2012/0138988 A1* | 6/2012 | Lee | H01L 33/58 257/98 |
| 2012/0193660 A1* | 8/2012 | Donofrio | H01L 33/505 257/98 |

* cited by examiner

LIGHT EMITTING DIODE PACKAGE AND METHOD OF MANUFACTURE

RELATED APPLICATIONS

This application is related to and claims the benefit of and priority to U.S. application Ser. No. 13/413,293 entitled "Light Emitting Diode Package and Method of Manufacture", filed on Mar. 6, 2012, which claims the benefit of and priority to U.S. Provisional Application Nos. 61/449,685 and 61/449,686, both filed on Mar. 6, 2011, all of which are hereby incorporated by reference.

TECHNICAL FIELD

The present application is directed to a light emitting diode (LED) device implemented on a wafer cover layer and provided with features permitting efficient and repeatable manufacture of the same.

BACKGROUND

A light emitting diode (LED) is a semiconductor device that is configured to receive electrical power or stimulation and to output electromagnetic radiation, commonly in the visible range of the spectrum (light). Portions of a LED comprise doped semiconductor materials that operate to combine charge in a way that releases said light energy from the body of the LED material. This effect is sometimes referred to as electroluminescence. The output energy or light is determined by the materials and operating conditions of the LED, including the energy band gap of the LED material and the electrical biasing of the LED.

Light emitting diodes (LEDs) compare favorably to other sources of light and are especially useful in certain applications and markets. For example, LED lighting generally provides advantages with respect to energy efficiency, compact and rugged and long-lasting design and form factor, and other features. LED lighting compares favorably with other sources in the amount of light energy generated in the visible electromagnetic spectrum compared to the infra-red or heat energy wasted by the light source. In addition, LED lights include fewer environmentally damaging components when compared to other light forms, and therefore provide better compliance with restrictions on hazardous substances (RohS) regulations.

That said, conventional LED devices can be relatively costly to manufacture by some metrics when compared to other light sources. One reason for this is the exacting packaging requirements for manufacturing LEDs. LED packaging calls for proper clean conditions, micro-fabrication facilities similar to other semiconductor manufacturing operations, sealing requirements, optical requirements, the use of phosphor in LED applications, as well as packaging that is designed to handle the conduction of heat generated in the devices.

Conventional LED packaging includes silicon (Si) or Ceramic based carrier substrates. The LEDs can be mounted on the carrier, or alternatively the many LEDs can be mounted on a wafer of the carrier and the LEDs are singulated at the end of the packaging process. The wafer based approach is termed wafer level assembly packaging (WLP). However, these conventional techniques require the use of a carrier substrate to support the LED, which can double the cost of making and packaging the LED device. In addition, the carrier substrate greatly increases the thermal resistivity of the device and adversely affects its heat removal characteristics.

Accordingly, there is a need for LED devices that do not suffer from some or all of the above problems.

SUMMARY

A light emitting diode (LED) device and packaging for same is disclosed. In some aspects, the LED is manufactured by epitaxial growth or other chemical or physical deposition techniques of a plurality of layers. Certain layers act to promote mechanical, electrical, thermal, or optical characteristics of the device. The device avoids design problems, including manufacturing complexities, costs and heat dissipation problems found in conventional LED devices. Some embodiments include a plurality of optically permissive layers, including an optically permissive cover substrate or wafer stacked over a semiconductor LED and positioned using one or more alignment markers.

Some embodiments are directed to a light emitting device, comprising a semiconductor LED including doped and intrinsic regions thereof; a first surface of said semiconductor LED being metallized with an electrically conducting metallization layer over at least a portion of said first surface; an optically permissive layer proximal to a second surface of said semiconductor LED, said first and second surfaces of said semiconductor LED being on opposing faces thereof; an optically definable material proximal to or within said optically permissive layer that affects an optical characteristic of emitted light passing there through; and an optically permissive cover substrate covering at least a portion of the above components.

Other embodiments are directed to ways of making such a light emitting device or a group of devices on a wafer in a manufacturing context. Specifically, embodiments are directed to a method for making a light emitting device, the method comprising forming a plurality of doped layers in a light emitting device (LED) disposed on an optically permissive layer; forming a recess in said LED so as to allow electrical contact with a first doped layer of said LED at a depth of said first doped layer in said LED; metallizing at least a portion of a face of said LED so as to form a metallization layer provide electrical contact with said first doped layer and a second doped layer of said LED proximal to said face thereof; and using an optically permissive adhesive to mechanically secure said optically permissive layer to an optically permissive cover substrate.

BRIEF DESCRIPTION OF THE DRAWINGS

For a fuller understanding of the nature and advantages of the present concepts, reference is made to the following detailed description of preferred embodiments and in connection with the accompanying drawings, in which.

DETAILED DESCRIPTION

Modern LED devices are based on semiconducting materials and their properties. For example, some LEDs are made using gallium nitride (GaN) which is a type of bandgap semiconductor suited for use in high power LEDs. GaN LEDs are typically epitaxially grown on a sapphire substrate. These LEDs comprise a P-I-N junction device having an intrinsic (I) layer disposed between a N-type doped layer and a P-type doped layer. The device is driven using suitable electrical driving signals by way of electrodes or contacts coupled to the N and the P type portions of the LED. Electronic activity causes the emission of visible electromagnetic radiation (light) from the intrinsic portion of the device according to the electromotive force applied thereto and configuration of the device.

The embodiments described and illustrated herein are not meant by way of limitation, and are rather exemplary of the kinds of features and techniques that those skilled in the art might benefit from in implementing a wide variety of useful products and processes. For example, in addition to the applications described in the embodiments below, those skilled in the art would appreciate that the present disclosure can be applied to making and packaging power integrated circuit (IC) components, radio frequency (RF) components, micro electro-mechanical systems (MEMS), or other discrete components.

Figure 1:
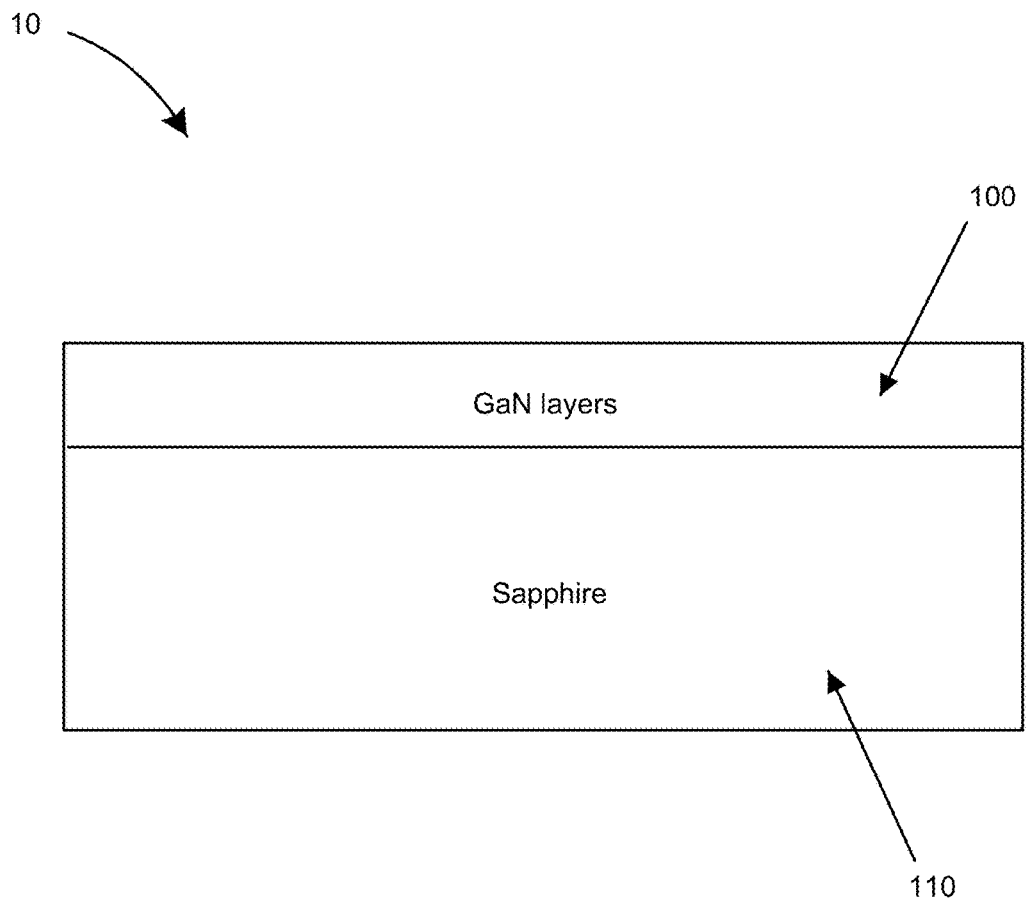
FIG. 1 illustrates a semiconducting LED layer above a sapphire layer according to the prior art.

FIG. 1 illustrates a LED device 10 such as those described above, having a GaN layer 100, commonly referred to as the LED, disposed on a sapphire layer 110. The device of FIG. 1 is usually processed using some semiconductor micro fabrication techniques. In some examples, portions of the LED (GaN layer) are etched away or removed using techniques known to those skilled in the art. Other applications of conducting and non-conducting layers are applied to such a base design, along with channels and vias for various functionality as will be described below.

Figure 2:
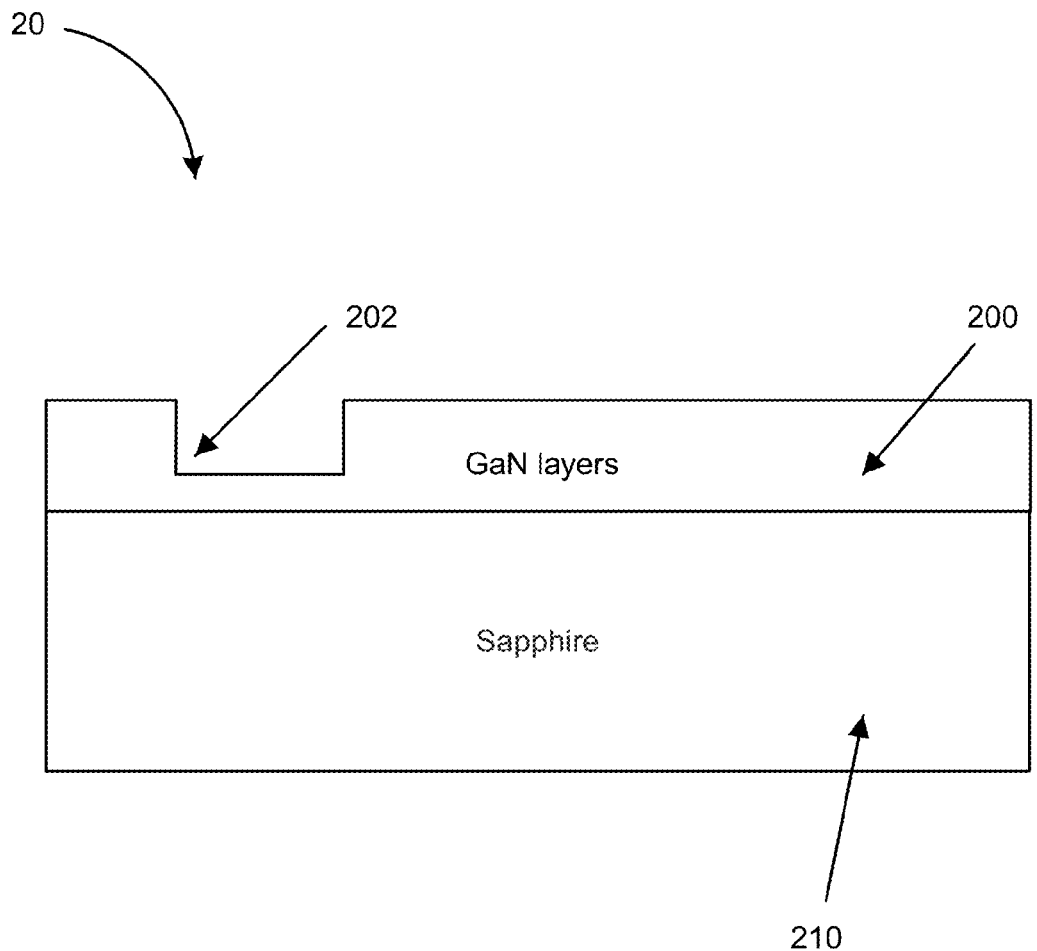
FIG. 2 illustrates a semiconducting LED layer with a cavity etched in a portion thereof on a sapphire layer according to the prior art.

FIG. 2 illustrates a LED device 20 like the one shown in FIG. 1 where a GaN layer 200 is disposed above a sapphire layer 210. A recess or groove or channel 202 is etched into a portion of the GaN layer 200.

It should be appreciated that GaN type LEDs are not the only kind of LED materials that can be employed in the present discussion, but that the present description is merely illustrative so that those skilled in the art can appreciate some preferred embodiments and methods for making and designing the present LEDs. Similarly, in the following preferred and exemplary illustrations, it is to be understood that many other similar and equivalent embodiments will be apparent to those skilled in the art and which accomplish substantially the same result. This is true as to variations in the geometry, layout, configurations, dimensions, and choice of materials and other aspects described in the present examples. Specifically, certain described elements and steps can be omitted, or others can be substituted or added to that which is described herein for the sake of illustration without materially affecting the scope of the present disclosure and inventions.

Figure 3:
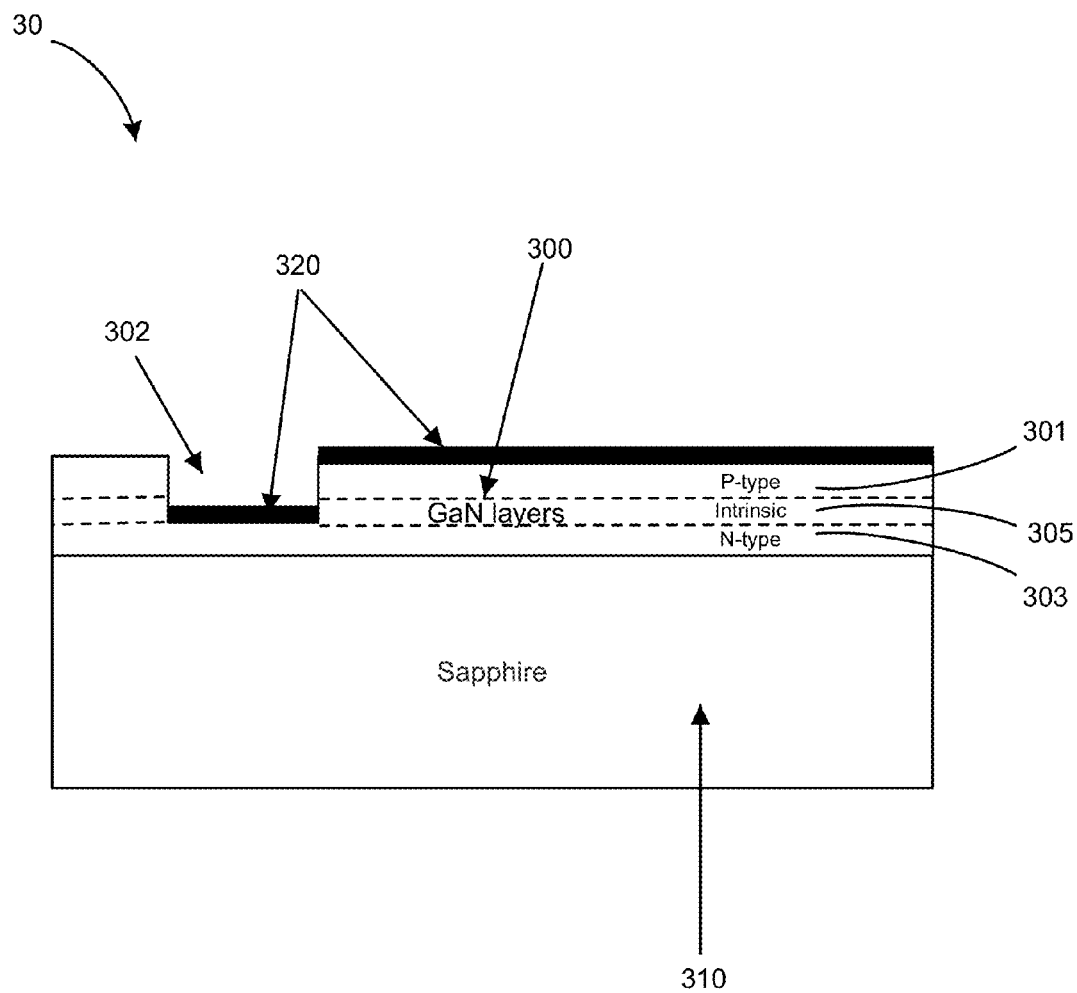
FIG. 3 illustrates metallization of a LED device according to some aspects.

FIG. 3 illustrates the result of metallization of the surface of the GaN layer 300 of the device of FIG. 2 using a step of applying a suitable metallic layer 320 to portions of LED device 30. Here, as before, a GaN layer 300 is disposed on a sapphire layer 310. In an embodiment, the GaN layer 300 comprises a P-I-N junction having strata therein including a P-type doped layer 301 that is proximal to the bulk surface of the GaN layer 300 and distal from the sapphire layer 310, a N-type doped layer 303 within GaN layer 300 that is proximal to the sapphire layer 310, and an intrinsic (I) semiconductor layer 305 in the middle, between the P and N type layers 301 and 303. In operation, electrical biasing of the P-type layer 301 against the N-type layer 303 causes photon emission from intrinsic layer 305.

As mentioned before, a recess 302 is etched into a portion of the surface of GaN layer 300. The depth of recess 302 may be shallow or deep, and is commensurate with the thickness of the GaN layer 300 and the P-I-N strata therein.

Furthermore, a metallization layer 320 is applied to at least a portion of the surface of the GaN layer 300. The metallization layer 320 can extend to cover both the bulk surface of the GaN layer 300 as well as areas that became exposed in recess 302 after it was etched into the bulk of the GaN layer 300.

Figure 4:
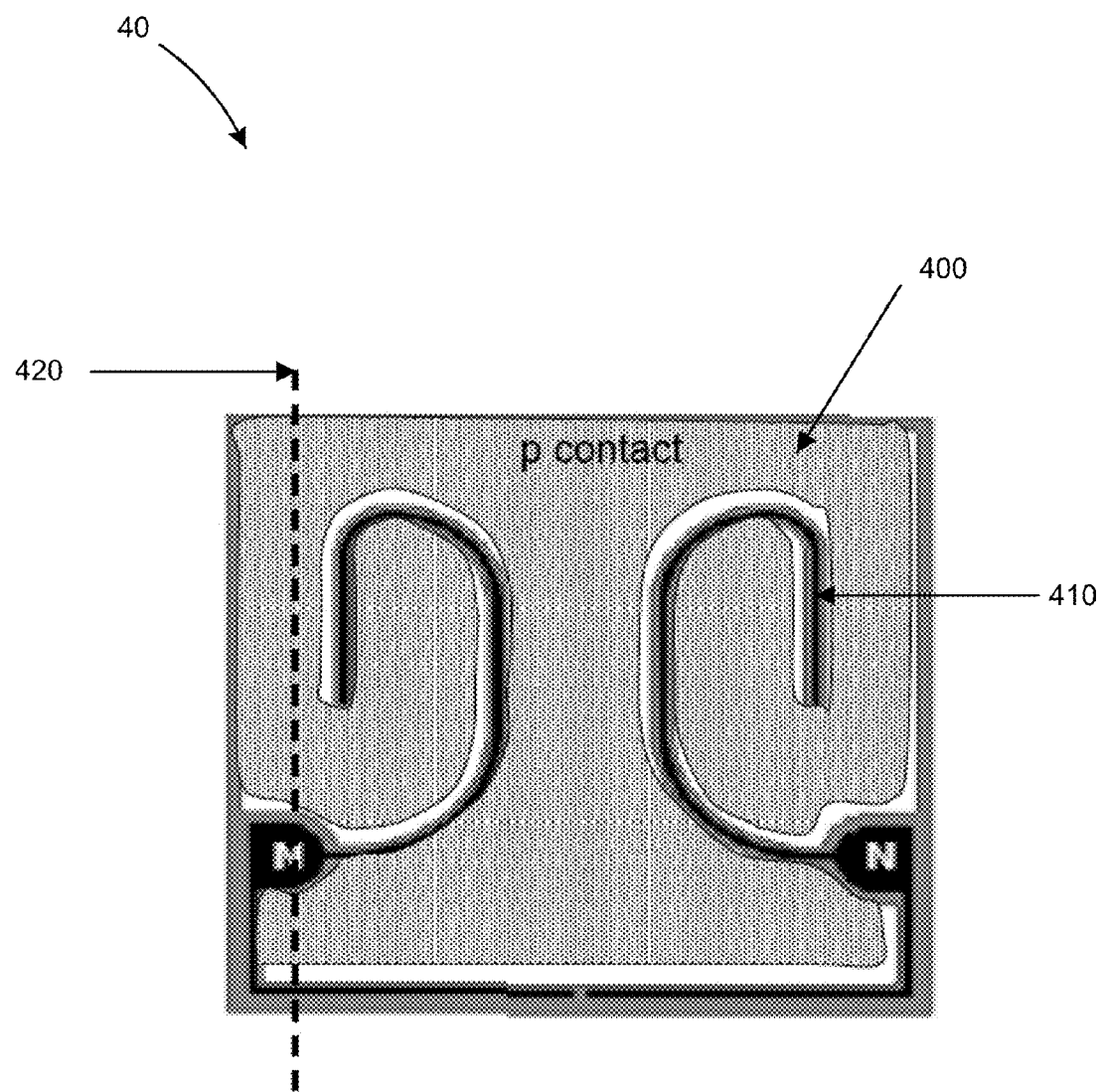
FIG. 4 illustrates a top view of an exemplary LED device.

In an embodiment, the recess 302 is created sufficiently deep so as to allow contact between an electrical connection and the N-type layer 303 to drive the LED. In this way, a set of contacts can be applied to the N-type layer 303 and the P-type layer 301 to drive or excite the LED device 30. Current can thus generally flow from a conducting electrode coupled to the N-type layer 303 to another conducting electrode coupled to the P-type layer 301. The metal can be Al, Au, Ag, Cu or other conducting material. It should be noted that state of art method of electrode formation includes depositing a SiO2 or other electrically insulating and optically transparent layer on top of the P and exposed N layers. This layer is then exposed using lithography and chemical etching to reveal the layers in specific locations which become the contact pads. The metal is then deposited on top of the insulating layer and electrical contact is facilitated in the exposed portions. Other state of art techniques include selective doping of contact areas to reduce electrical resistivity. In an embodiment the top metal layer extends over the contact openings in the insulating layer to cover substantially all the unetched parts of the LED as shown in FIGS. 3 and 4. In another embodiment, the metal is designed to have contact pads, areas where the metal has a substantially continuous area greater than 100×100 microns. The extended metal covering provides a mirror for reflecting the light towards the Sapphire. The metal layer for providing the mirror is preferably Al, or Ag. The metal contact can have a plurality of metal constituents each with a specific purpose, e.g. light reflection, adhesion to the GaN layers or matching the work function of the GaN layers. In another embodiment, the metal cover can be composed of two or more, electrically isolated parts. One part(s) is electrically connected to the P layer and provides electrical contact as well as thermal contact, and the other part(s) provide optical reflection and thermal connection.

FIG. 4 illustrates a top view of an exemplary LED device 40. The cross sectional line 420 is substantially corresponding to the side view shown in FIG. 3. The drawing shows an example of features arranged on a face 400 of the device configured to have a convoluted or fingered or patterned layout 410. A bottom metal pad area defines an alignment tolerance in the assembly of the LED and creation of the electrical contacts. Hence in one embodiment it is taught to increase the pad size to 150×150 microns to relax the required tolerances. The thickness of the metal can be 0.5-5 microns, but this example is not given by way of limitation.

Figure 5:
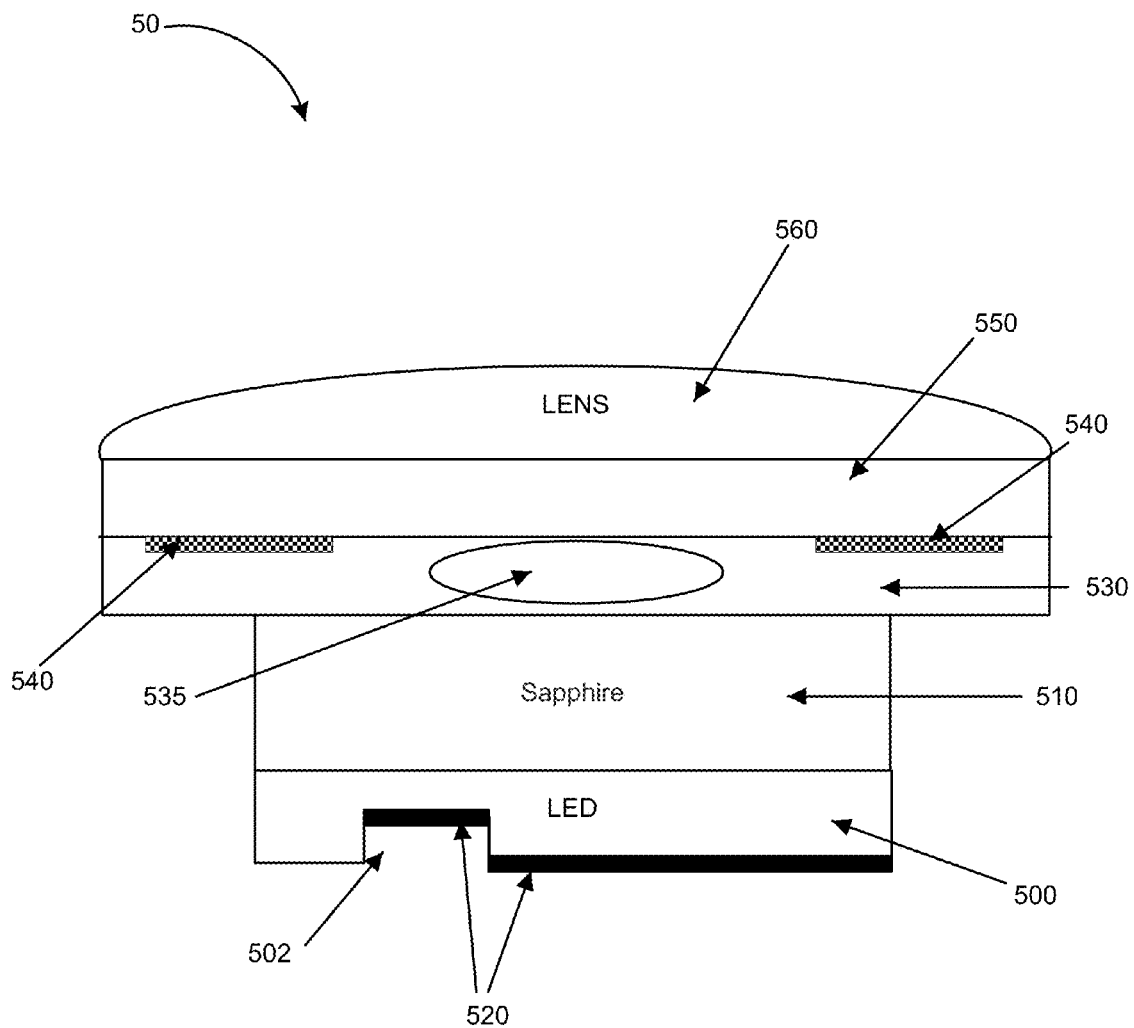
FIG. 5 illustrates a cross sectional view of another exemplary LED device.

FIG. 5 illustrates a cross sectional view of an exemplary LED device 50. The device 50 includes the stated LED semiconducting layer or layers 500 as discussed above, along with etched recess 502 and metallization areas 520. The LED (e.g., GaN) layer 500 is disposed on a sapphire layer 510 as before.

Here, an optically transparent or transmissive adhesive layer 530 is placed against the opposing side of the sapphire layer 510 than the LED material 500 (meaning, one face of the sapphire layer 510 is proximal to the LED material layer 500 and the other opposing face of sapphire layer 510 is proximal to the transparent adhesive layer 530. The transparent adhesive layer 530 may be composed of silicone or some other suitable adhesive, which may also be photo definable material that can provide adhesion or epoxy quality to bond or mechanically couple elements of LED device 50. In an additional embodiment, the adhesive is index matched to the Sapphire to reduce optical reflections at the interface.

Within, or contiguous to transparent adhesive layer 530 is a region containing phosphor and/or quantum dot material (QD) 535. In operation, photons emitted from LED layer 500 travel through said sapphire layer 510 and pass through the optically transparent layer 530 and the region containing the phosphor and/or quantum dots 535. This causes color (wavelength) control and emission of selective desired light out of the LED device as further described herein.

One, two or more alignment marks 540 are provided on or in the transparent adhesive layer 530 and are used to align the LED body over a cover substrate 550 sheet and generally in an extended wafer structure during manufacture. The cover substrate 550 provide structural presence and mechanical coupling for elements of the LED device 50. The cover substrate 550 is also transparent or optically transmissive to light in the wavelength emitted by LED layer 500 or by the combination of the LED layer 500 and the phosphor material.

In some embodiments, an optical lens 560 may be placed on the cover substrate 550 substantially above the body of the LED emitting portions of the device 50. The lens 560 can act to spread, diffuse, collimate, or otherwise redirect and form the output of the LED.

The system may be coupled to other optical elements as would be appreciated by those skilled in the art. One or more optical lens or assembly of optical lenses, Fresnel layers, filters, polarizing elements, or other members can be used to further affect the quality of the light provided by the LED device.

Figure 6:
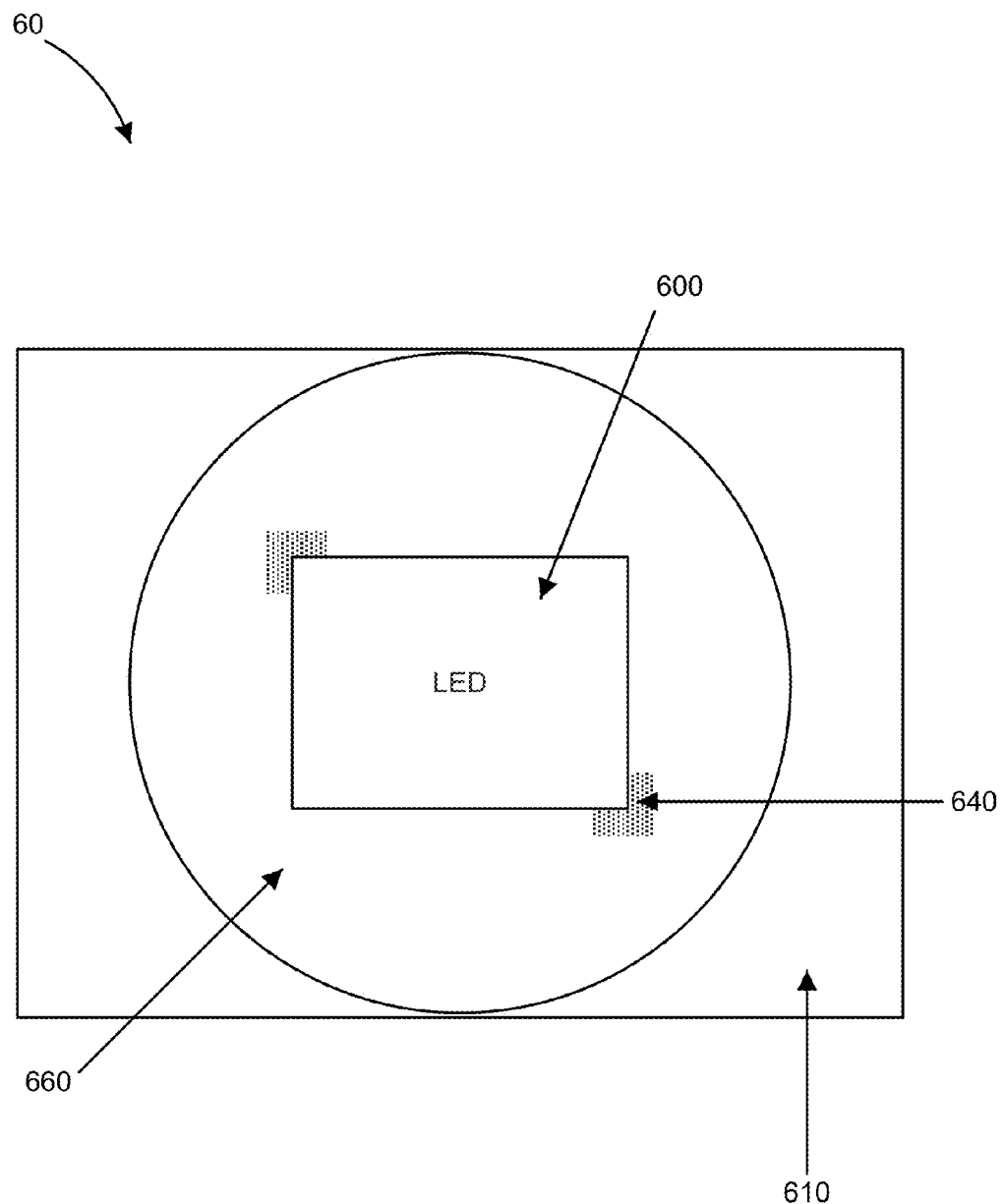
FIG. 6 illustrates an LED device 60 in a top view thereof.

FIG. 6 illustrates an LED device 60 in a top view thereof. The device includes substantially the elements described above with regard to FIG. 5, including an LED emitting body 600 and positioning or alignment markers 640, lens 660, arranged on a patterned cover substrate 610. In an embodiment, the LED is positioned with respect to said alignment marks. Between adjacent LEDs on a wafer there is a space of, e.g., 50-1000 microns for subsequent processing and dicing of the LEDs.

The LEDs are individually assembled on a carrier wafer, with the sapphire layer facing the carrier wafer layer. The carrier wafer layer is of optically transparent material such as glass or plastic as described above. The cover can include other optical components such as lenses or light diffusing structures or light guiding structures. As mentioned, the phosphor or quantum dot layers enable the conversion of the light generated by the LED to other colors. The most common is the use of phosphor to enable White light from a blue LED. In one embodiment the lens shape is created by the surface tension of a drop of polymer or silicone material. In another embodiment the lens is created by hot embossing of a polymer which is applied to one side of the carrier wafer. The carrier wafer may be further patterned to create specific drop shapes, sizes and desired surface qualities.

Figure 7:
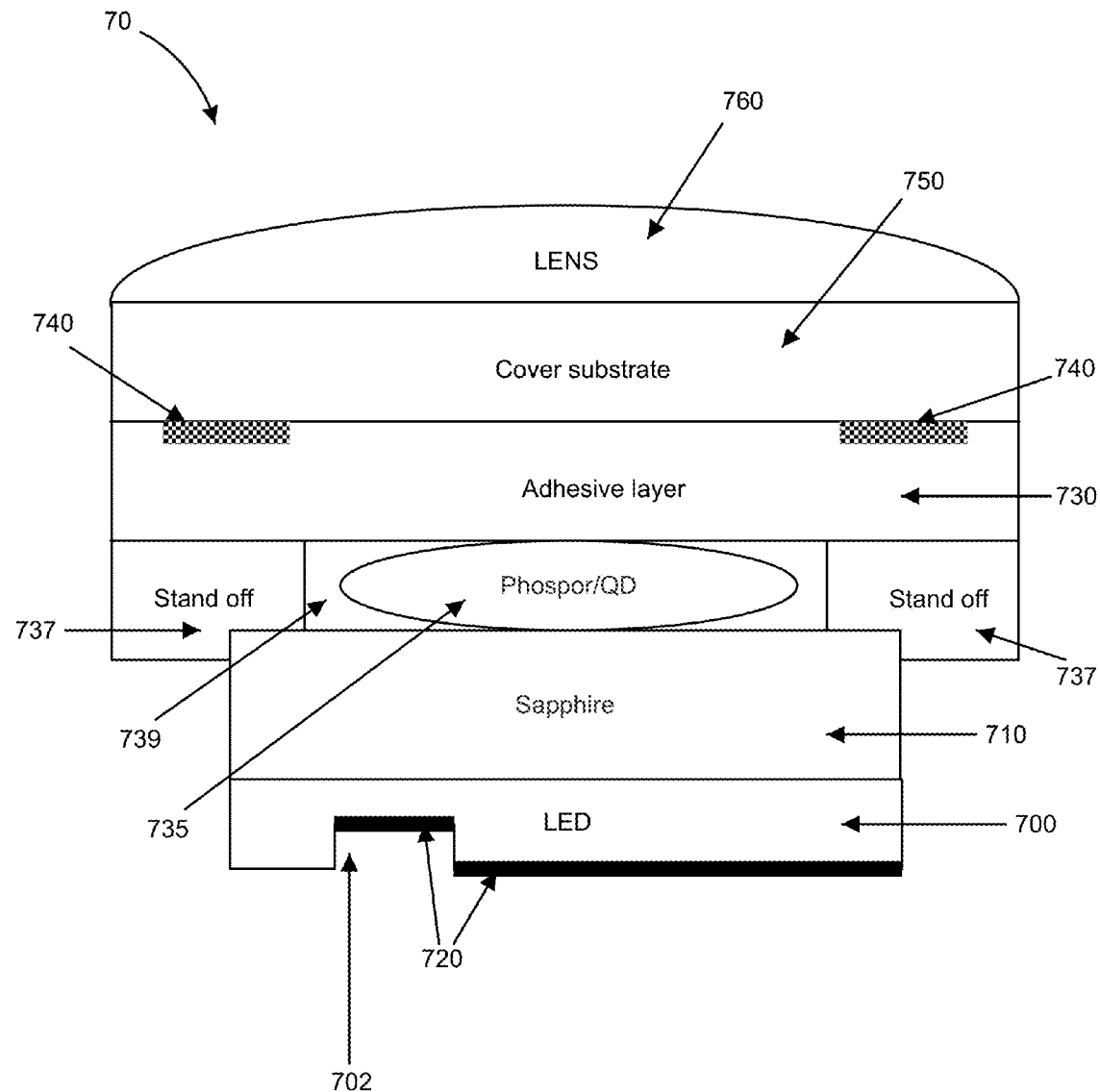
FIG. 7 illustrates another exemplary cross sectional view of a LED device.

FIG. 7 illustrates another exemplary cross sectional view of a LED device 70. Standoff structures 737, made of a suitable mechanically supportive material are created on the carrier wafer. The standoff structures 737 can comprise a thermoplastic material and created by embossing or injection molding, or the structures can be made by applying a layer of photo definable material such as polyamide or solder mask and exposing the material to light using a suitable mask. The standoff structures 737 can be used to encase the QD or phosphor material 735, or alternatively to provide a cavity for the material deposition. The other elements of LED device 70 are similar to similarly numbered elements described above.

Figure 8:
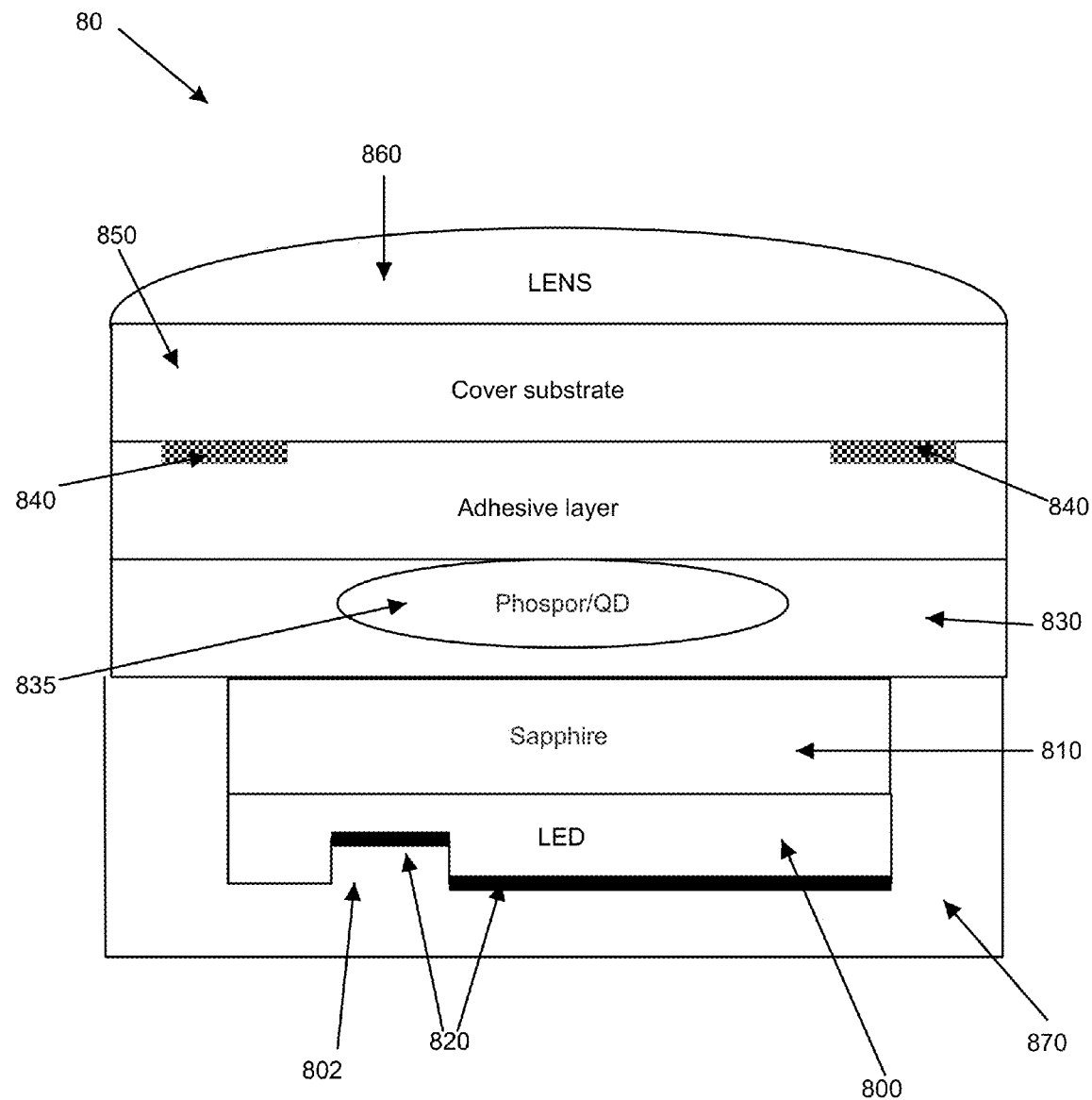
FIG. 8 illustrates an exemplary LED device comprising a passivation layer.

FIG. 8 illustrates a LED device 80 similar to those described above. Here, a passivation layer 870 has been applied to surround certain portions of the device around LED semiconducting layer 800, metallization layer 820, and sapphire layer 810. The passivation layer 870 can comprise a non conductive layer and can be composed of $SiO_2$, SiN, AlN, $Al_2O_3$ or an organic material such as epoxy, or electrophoretic deposited paint as used in the car industry, or spray coated. In one embodiment, the passivation layer 870 has a thickness that ranges from 1 to 40 microns, depending on the material and required electrical passivation level. In an embodiment, the passivation layer 870 covers in a conformal manner the space between LEDs during manufacture. In another embodiment the spacing between the LEDs is not covered, or alternatively is revealed in a mechanical process such as dicing. The other elements of LED device 80 are similar to similarly numbered elements described above. In an additional embodiment the passivation layer can be designed to be reflective by incorporating appropriate material particles within such as ZnO.

Figure 9:
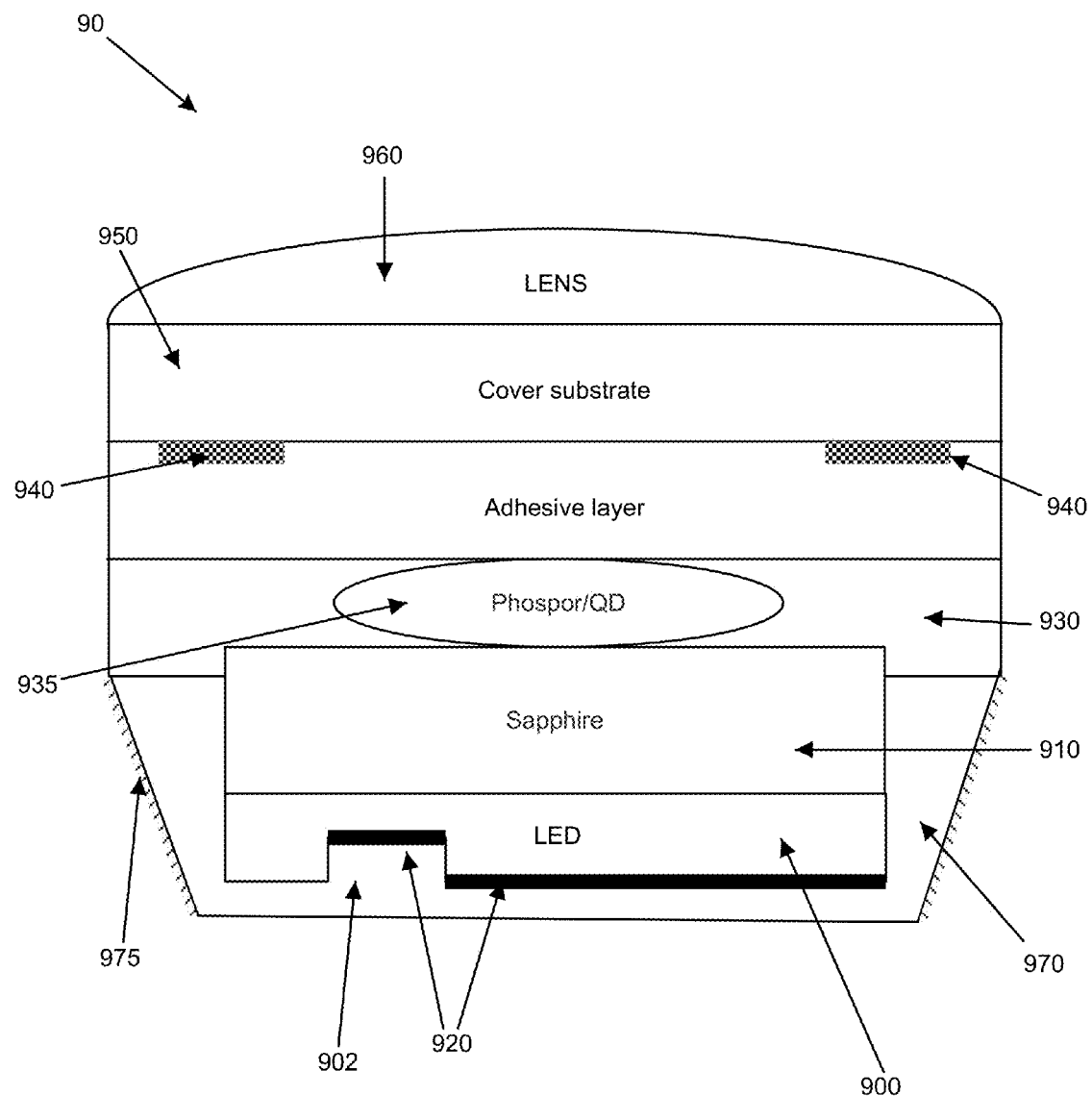
FIG. 9 illustrates an exemplary LED device having a shaped an optionally mirrored or metallized passivation layer.

FIG. 9 illustrates an exemplary LED device 90 having a shaped an optionally mirrored or metallized passivation layer 970 to enhance the performance of the device. The passivation at the diode side can be patterned in a manner to provide for example optical reflectivity by angling or shaping the edges 975 of passivation layer 970. The patterning of passivation layer 970 can be done using a mechanical dicing system with special blade or via chemical etching. In one embodiment a thermally conductive layer such as SiN or AlN is preferred to minimize the thermal conductance of the LED device package. The other elements of LED device 90 are similar to similarly numbered elements described above.

Figure 10:
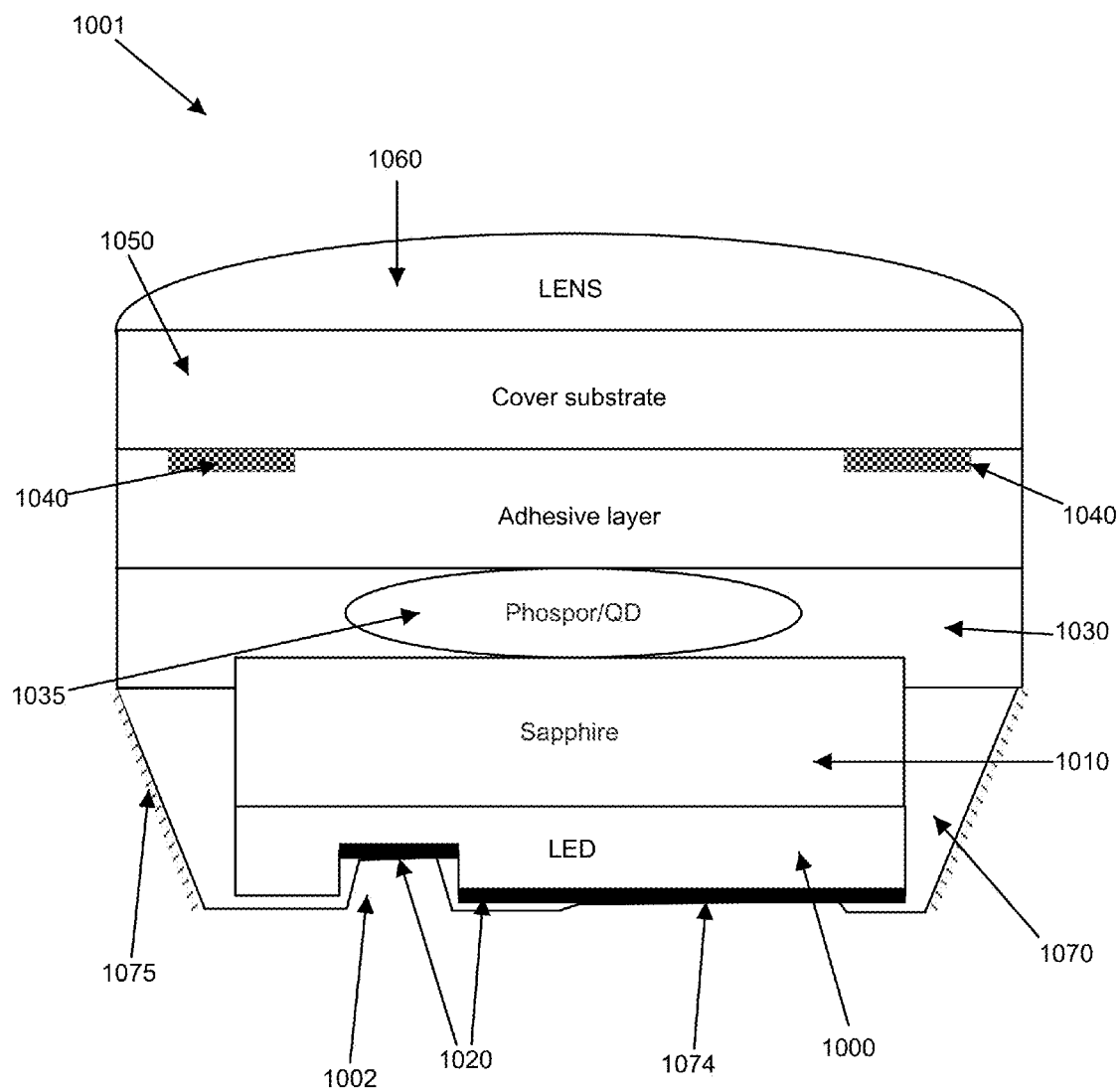
FIG. 10 illustrates another exemplary LED device.

FIG. 10 illustrates another exemplary LED device 1001. Similarly numbered elements discussed earlier are common to or similar to those in this exemplary embodiment. Here, contact holes are drilled, in one embodiment by use of a laser, through the passivation layer until reaching the metal pad and silicon substrate. If SiN or $SiO_2$ are used, a plasma etch can also be used to create the contact holes. If a laser is used, the laser can either stop at the metal pad (blind via) or cut through the pad and the electrical connection would then be done using the pad thickness. If the passivation layer is photo definable, than a lithography step can expose the pads. In another embodiment the organic passivation layer is etched using a hard mask made of inorganic material such as a thin metal or insulating layer and then using plasma etch to remove the organic material.

It is noted that passivation layer 1075 is cut or etched away as stated above so as to provide conducting access at least to the N-type semiconductor proximal to laser drilled recess 1072 and the P-type semiconductor proximal to portion 1074 of metallization layer 1020. The passivation layer is also removed to enhance the heat conduction of the LED. Hence to optimize the heat conductance, a maximal contact should be made between the metal and metal pads on the LED and the metal layer. This is done by opening the largest possible area on the passivation layer and preferably greater than 80%. If the LED is designed with a thermal pad structure then the P connection can be connected to thermal and P pad or alternatively three metal connections are facilitated, N, P and thermal. In another embodiment, the passivation is also removed in areas where there is no metal layer, only the electrically insulating layer. This can occur, if instead of the LED described previously, a standard LED is used in which the metal covers only a small portion of the top of the LED. In this case the metal layer deposited in this stage will provide the heat removal and light reflection. In this manner, the exposed portions of the LED will extend beyond the metal areas. The newly deposited metal will again cover substantially all of the LED structure. In another embodiment, if the electrical passivation layer is optically reflecting and heat conducting the layer may be maintained and the metal passivation will cover substantially all the LED area but will make a direct connection to the LED metal pads, and in other areas the connection layers would be through the passivation layer, i.e. the layer stack would be, LED, LED passivation layer, packaging passivation layer which provides low thermal resistance and light reflection, packaging metal for heat conduction.

Figure 11:
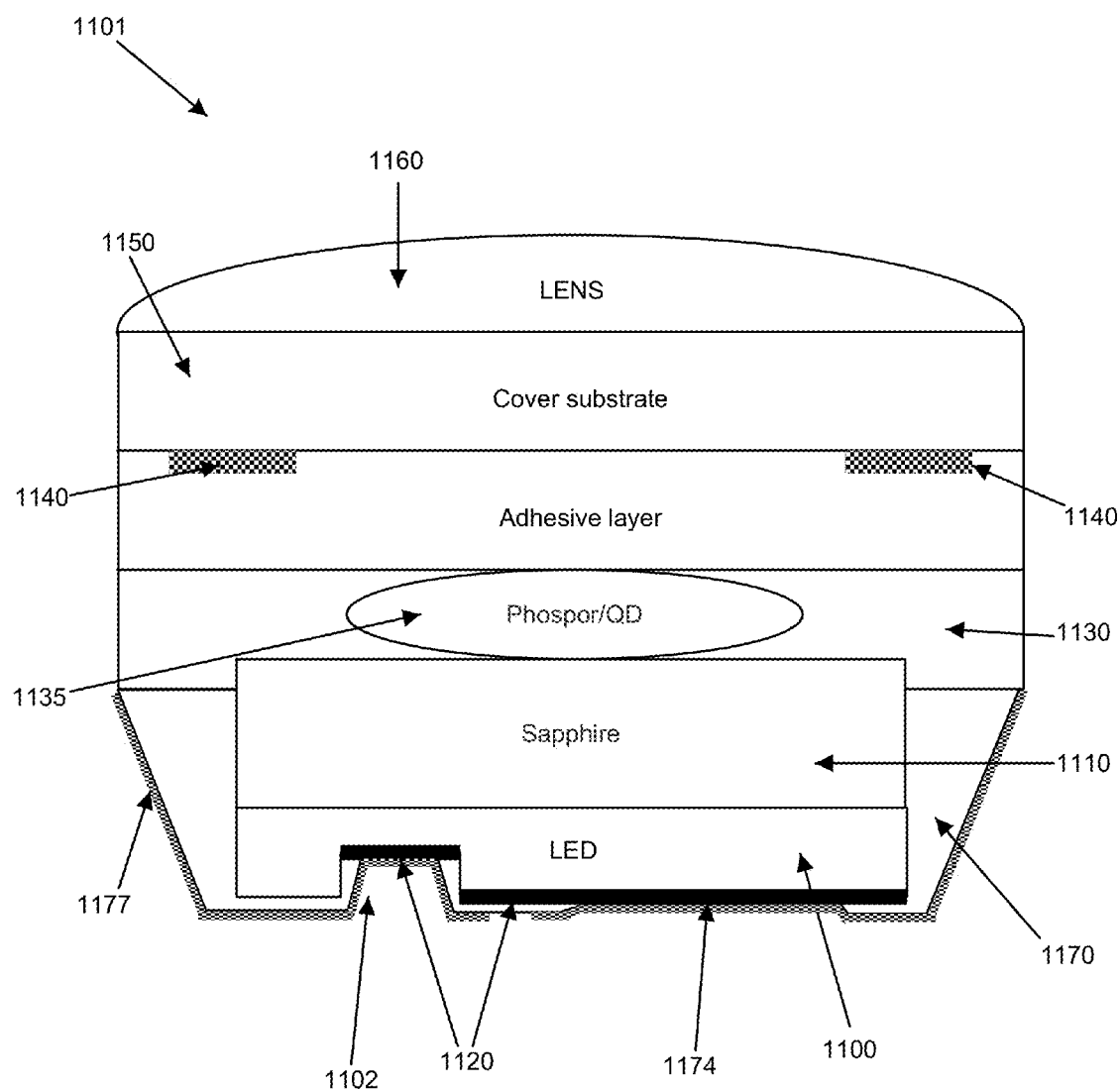
FIG. 11 illustrates yet another embodiment of a LED device.

FIG. 11 illustrates yet another embodiment of a LED device 1101. Here, a metal seed layer 1177 is applied to the passivation layer 1170. The metal seed layer 1077 may be composed of any of titanium, chrome, nickel, palladium, platinum, copper or combinations of these. In a preferred embodiment, if the metal layer serves to reflect light from the LED towards the Sapphire, then the first metal seed layer should be a suitable light reflecting material such as Al, or Ag. The seed layer can be thickened using sputtering over the initial seed layer. In one embodiment the seed layer is patterned using electrophoretic deposited photo resist, spray coating resist, or thick resist, in one embodiment greater than 50 microns. The resist is patterned to create the electrical routing connections and under bump metallization (UBM). After patterning the resist, a thick metal layer, in one preferred embodiment between 10 and 40 microns is plated in the defined patterns. The resist is removed and the bare seed layer is etched, in one non-limiting embodiment by using a wet metal etch. In one embodiment a solder mask is applied to form such a layer. In operation, the layer 1177 provides enhanced electrical conductivity between external electrical components and the metallization layer or conducting pads of the device. This layer 1177 also provides maximum enhanced heat removal from LED layer 1100.

Figure 12:
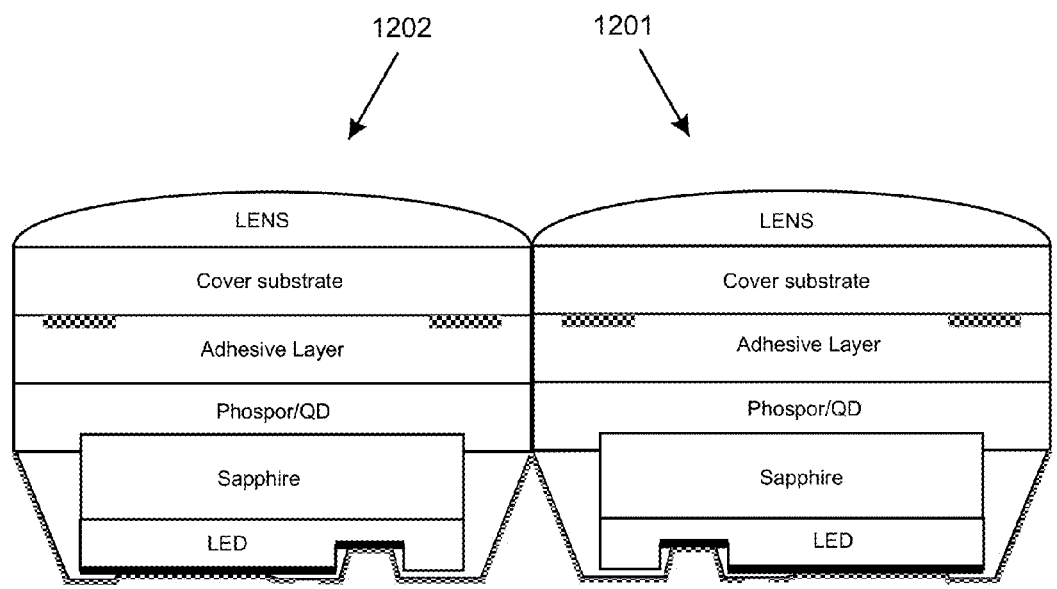
FIG. 12 illustrates how more than one LED device can be manufactured on a single manufacturing platform or wafer.

FIG. 12 illustrates how more than one LED device like those described above can be manufactured on a single manufacturing platform or wafer. Here, two LED units 1201 and 1202 are electrically connected in the metallization step of manufacturing the units. The LEDs can be connected in parallel, serial or combinations of such connections. These can be cut apart or in other embodiments can be left arranged on the substrate without cutting so as to form a multi LED unit or light source. In addition to LED devices, this approach can support placement and electrical connection of differing LEDs, or other electronic components including integrated circuit LED driver, capacitors, diodes, anti static discharge diodes, temperature sensors, color sensors, image sensors, fuses and other similar elements.

The present invention should not be considered limited to the particular embodiments described above, but rather should be understood to cover all aspects of the invention as fairly set out in the present claims. Various modifications, equivalent processes, as well as numerous structures to which the present invention may be applicable, will be readily apparent to those skilled in the art to which the present invention is directed upon review of the present disclosure. The claims are intended to cover such modifications.

What is claimed is:

1. A light emitting device, comprising:
an optically transparent cover substrate;
an optically transparent layer contacting a bottom surface of said optically transparent cover substrate, said optically transparent layer including an optically definable material wherein said optically definable material is disposed in a portion of said optically transparent layer;
a semiconductor LED including a LED carrier layer, a positively-doped region, an intrinsic region, and a negatively-doped region, wherein said intrinsic region is between said positively-doped region and said negatively-doped region, said LED carrier layer disposed on said negatively-doped region, said LED carrier layer contacting a first portion of a bottom surface of said optically transparent layer;
a passivation layer disposed on said semiconductor LED and on an exposed portion of said bottom surface of said optically transparent layer;
a first electrical contact disposed in a first contact hole defined in said passivation layer, said first electrical contact in electrical communication with said positively-doped region; and
a second electrical contact disposed in a second contact hole defined in said passivation layer and said semiconductor LED, said second electrical contact in electrical communication with said negatively-doped region,
wherein a first surface of said semiconductor LED has a first length along a horizontal axis, said horizontal axis parallel to said first surface of said semiconductor LED, and
wherein said portion of said optically transparent layer has a second length with respect to said horizontal axis, said second length less than said first length.

2. The light emitting device of claim 1 wherein said optically definable material is embedded in said portion of optically transparent layer.

3. The light emitting device of claim 1 wherein said optically transparent layer is comprised of silicone.

4. The light emitting device of claim 3 wherein said optically definable material is comprised of phosphor.

5. The light emitting device of claim 1 wherein said first and second electrical contacts are comprised of at least one of aluminum, gold, silver, and copper.

6. The light emitting device of claim 1 wherein said passivation layer is comprised of at least one of $SiO_2$, SiN, AlN, $Al_2O_3$, an epoxy, and an electrophoretic deposited paint.

7. The light emitting device of claim 1 further comprising an electroplated material disposed on said first and second electrical contacts.

8. A light emitting device, comprising:
an optically transparent cover substrate;
an optically transparent layer contacting a bottom surface of said optically transparent cover substrate, said optically transparent layer including an optically definable material wherein said optically definable material is disposed in a portion of said optically transparent layer;
a semiconductor LED including a LED carrier layer, a positively-doped region, an intrinsic region, and a negatively-doped region, wherein said intrinsic region is between said positively-doped region and said negatively-doped region, said LED carrier layer disposed on said negatively-doped region, said LED carrier layer contacting a first portion of a bottom surface of said optically transparent layer;
a passivation layer disposed on said semiconductor LED and on an exposed portion of said bottom surface of said optically transparent layer;
a first electrical contact disposed in a first contact hole defined in said passivation layer, said first electrical contact in electrical communication with said positively-doped region; and
a second electrical contact disposed in a second contact hole defined in said passivation layer and said semiconductor LED, said second electrical contact in electrical communication with said negatively-doped region,
wherein said optically transparent layer has a first height along a vertical axis, said vertical axis orthogonal to said bottom surface of said optically transparent layer, and
wherein said portion of said optically transparent layer has a second height along said vertical axis, said second height less than said first height.

9. The light emitting device of claim 8 wherein said optically definable material is embedded in said portion of optically transparent layer.

10. The light emitting device of claim 8 wherein said optically transparent layer is comprised of silicone.

11. The light emitting device of claim 10 wherein said optically definable material is comprised of phosphor.

12. The light emitting device of claim 8 wherein said first and second electrical contacts are comprised of at least one of aluminum, gold, silver, and copper.

13. The light emitting device of claim 8 wherein said passivation layer is comprised of at least one of $SiO_2$, SiN, AlN, $Al_2O_3$, an epoxy, and an electrophoretic deposited paint.

14. The light emitting device of claim 8 further comprising an electroplated material disposed on said first and second electrical contacts.

* * * * *